(12) United States Patent
Yu et al.

(10) Patent No.: US 12,707,865 B2
(45) **Date of Patent: *Aug. 11, 2026**

(54) DISPLAY PANEL, MANUFACTURING METHOD THEREOF AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Shengrong Yu, Wuhan (CN); Liang Ma, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 145 days.

This patent is subject to a terminal disclaimer.

(21) Appl. No.: 18/745,911

(22) Filed: Jun. 17, 2024

(65) Prior Publication Data

US 2024/0341156 A1 Oct. 10, 2024

Related U.S. Application Data

(63) Continuation-in-part of application No. 17/622,642, filed as application No. PCT/CN2021/136856 on Dec. 9, 2021, now Pat. No. 12,041,839.

(30) Foreign Application Priority Data

Nov. 25, 2021 (CN) ......................... 202111408924.1

(51) Int. Cl.
*H10K 59/80* (2023.01)
*H10K 59/131* (2023.01)

(52) U.S. Cl.
CPC ......... *H10K 59/873* (2023.02); *H10K 59/131* (2023.02)

(58) Field of Classification Search
CPC .. H10K 59/873; H10K 59/131; H10K 59/122; H10K 59/40; H10K 59/8731
See application file for complete search history.

(56) References Cited

U.S. PATENT DOCUMENTS 10,886,339 B2 * 1/2021 Won ...................... G06F 3/0443
11,296,157 B2 * 4/2022 Won .................. H10K 59/8731
(Continued)

FOREIGN PATENT DOCUMENTS

CN 105810716 A 7/2016
CN 106803514 A 6/2017
(Continued)

OTHER PUBLICATIONS

International Search Report in International application No. PCT/CN2021/136856, mailed on Aug. 1, 2022.
(Continued)

*Primary Examiner* — Douglas W Owens
(74) *Attorney, Agent, or Firm* — PV IP PC; Peter Stecher; Wei Te Chung

(57) ABSTRACT

A display panel, a manufacturing method thereof and a display device are provided. A thin film transistor layer disposed on a substrate includes a first metal trace at least disposed in a wire replacement region. An encapsulation layer includes an inorganic encapsulation sub-layer, which is disposed on one side of the thin film transistor layer away from the substrate and stacked with an inorganic spacer layer. A touch metal layer includes a touch trace, which is at least disposed in the wire replacement region and electri-
(Continued)

cally connected to the first metal trace. The inorganic encapsulation sub-layer is not overlapped with the wire replacement region.

19 Claims, 8 Drawing Sheets

(56) References Cited

U.S. PATENT DOCUMENTS

| | | | | |
|---|---|---|---|---|
| 12,041,839 | B2 * | 7/2024 | Yu | H10K 59/1201 |
| 2017/0278918 | A1 * | 9/2017 | Jeon | H10K 77/111 |
| 2019/0102005 | A1 | 4/2019 | Matsumoto | |
| 2020/0411596 | A1 * | 12/2020 | Guo | G06F 3/0412 |
| 2022/0158129 | A1 * | 5/2022 | Kim | G06F 3/04164 |
| 2022/0320465 | A1 * | 10/2022 | Hou | H10K 59/8731 |
| 2023/0209967 | A1 * | 6/2023 | Won | G06F 3/0412<br>345/174 |

FOREIGN PATENT DOCUMENTS

| | | | |
|---|---|---|---|
| CN | 106951125 | A | 7/2017 |
| CN | 108874206 | A | 11/2018 |
| CN | 108987436 | A | 12/2018 |
| CN | 110400891 | A | 11/2019 |
| CN | 110851019 | A | 2/2020 |
| CN | 110854129 | A | 2/2020 |
| CN | 111430440 | A | 7/2020 |
| CN | 112667106 | A | 4/2021 |
| KR | 20180068011 | A | 6/2018 |

OTHER PUBLICATIONS

Written Opinion of the International Searching Authority in International application No. PCT/CN2021/136856, mailed on Aug. 1, 2022.

Chinese Office Action issued in corresponding Chinese Patent Application No. 202111408924.1 dated Oct. 28, 2022, pp. 1-11.

* cited by examiner

DISPLAY PANEL, MANUFACTURING METHOD THEREOF AND DISPLAY DEVICE

CROSS-REFERENCE TO RELATED APPLICATIONS

This application is a continuation-in-part of U.S. application Ser. No. 17/622,642, filed on Dec. 23, 2021, which claims priority to and the benefit of Chinese Patent Application No. 202111408924.1, filed on Nov. 25, 2021, the contents of both applications are incorporated herein by reference in their entireties.

FIELD OF INVENTION

This disclosure relates to a technical field of a display, and more particularly to a display panel and a manufacturing method thereof, and a display device having the display panel.

BACKGROUND

In an organic light-emitting diode (OLED) display device, a touch display device provides a touch-based user interface, through which the user can intuitively, conveniently and directly input data or instructions to the device without using a conventional data entry system, such as a button, a keyboard or a mouse. Therefore, the touch display device needs to sense a touch executed by the user and precisely determine the touch coordinates. The touch sensing technologies may be divided into a resistive type, a capacitive type, an optical type and a sonic type. At present, capacitive touch panels are adopted in most OLED display screens on the market. Induced coordinates can be detected according to a capacitance change generated by a combination of electrostatic charges of a finger and a sensing unit.

The direct on touch (DOT) technology has gradually replaced the add-on technology and become a most popular process at present. DOT represents that the touch panel is embedded into a film layer above a substrate. The currently common technology is to prepare a TP layer above an encapsulation layer. Compared with the add-on touch structure, the DOT structure becomes lighter and thinner and has the higher transmittance, and can be applied to a flexible display substrate. At present, the DOT technologies can be classified into self-capacitance (SDOT) and mutual capacitance (MDOT), wherein SDOT is to detect the change of the self-capacitance of each sensing unit with respect to GND, while the MDOT is to detect the capacitance formed between two cross sensing blocks.

In the touch panel, a touch electrode is connected to a bezel region of the panel through a touch trace, and the touch trace passing through a wiring replacement hole is connected to a lower metal layer, and is electrically connected to a bonding terminal through the lower metal layer. However, an inorganic layer in the encapsulation layer extends to a lower bezel region in a depositing process, and has a thickness getting thinner. So, in order to prevent the inorganic layer from being reserved in the wiring replacement hole of the touch trace in the related technology, the wiring replacement hole is disposed outside a cover range of the inorganic layer, so that the wiring replacement hole is disposed in a direction away from a display region, and the bezel width of the touch panel gets larger. This is not advantageous to the narrow bezel requirement of the touch panel.

SUMMARY OF INVENTION

Technical Problems

An embodiment of this disclosure provides a display panel, a manufacturing method thereof and a display device capable of reducing a distance between a wire replacement region and a display region and reducing a bezel width of the display panel.

Technical Solutions

An embodiment of this disclosure provides a display panel including a display region and a non-display region disposed on at least one side of the display region, the non-display region including a wire replacement region;

wherein the display panel further includes:

- a substrate;
- a thin film transistor layer, which is disposed on the substrate and includes a first metal layer, wherein the first metal layer includes a first metal trace at least disposed in the wire replacement region;
- an encapsulation layer, which is disposed on one side of the thin film transistor layer away from the substrate, and includes an inorganic encapsulation sub-layer;
- a spacer layer, wherein the spacer layer and the inorganic encapsulation sub-layer are stacked on the one side of the thin film transistor layer away from the substrate; and
- a touch metal layer, which is disposed on the inorganic encapsulation sub-layer and one side of the spacer layer away from the substrate, and includes a touch trace at least disposed in the wire replacement region, wherein the touch trace is electrically connected to the first metal trace in the wire replacement region;

wherein the inorganic encapsulation sub-layer does not overlap with the wire replacement region.

In one embodiment of this disclosure, the display panel further includes a bank structure, which is disposed on the substrate and in the non-display region and disposed between the wire replacement region and the display region; wherein both the inorganic encapsulation sub-layer and the spacer layer covers the bank structure, and extend from the bank structure in a direction away from the display region.

In one embodiment of this disclosure, on one side of the bank structure away from the display region, a thickness of the inorganic encapsulation sub-layer close to the bank structure is greater than a thickness of the inorganic encapsulation sub-layer away from the bank structure.

In one embodiment of this disclosure, boundaries of both the inorganic encapsulation sub-layer and the spacer layer in the non-display region are disposed between the bank structure and the wire replacement region.

In one embodiment of this disclosure, the inorganic encapsulation sub-layer is provided with a first opening in the wire replacement region; and the spacer layer is provided with a second opening corresponding to the first opening, and the touch trace is electrically connected to the first metal trace through the first opening and the second opening.

In one embodiment of this disclosure, the spacer layer is further disposed on a sidewall of the first opening, and a size of the second opening is less than a size of the first opening.

In one embodiment of this disclosure, the thin film transistor layer is provided with a third opening in the wire replacement region, the inorganic encapsulation sub-layer is further disposed on a sidewall of the third opening, a size of the first opening is less than a size of the third opening, and the touch trace is electrically connected to the first metal trace through the first opening, the second opening and the third opening.

In one embodiment of this disclosure, the encapsulation layer includes a first inorganic encapsulation sub-layer, an organic encapsulation sub-layer and a second inorganic encapsulation sub-layer arranged in a stacked manner, and the inorganic encapsulation sub-layer includes the first inorganic encapsulation sub-layer and the second inorganic encapsulation sub-layer.

In one embodiment of this disclosure, the spacer layer does not overlap with the wire replacement region.

According to the above-mentioned objectives of this disclosure, a display device is provided. The display device includes a main device body and a display panel. The display panel includes a display region and a non-display region disposed on at least one side of the display region. The non-display region includes a wire replacement region; wherein the display panel further includes:

a substrate;

a thin film transistor layer, which is disposed on the substrate and includes a first metal layer, wherein the first metal layer includes a first metal trace at least disposed in the wire replacement region;

an encapsulation layer, which is disposed on one side of the thin film transistor layer away from the substrate, and includes an inorganic encapsulation sub-layer;

a spacer layer, wherein the spacer layer and the inorganic encapsulation sub-layer are stacked on the one side of the thin film transistor layer away from the substrate; and a touch metal layer, which is disposed on the inorganic encapsulation sub-layer and one side of the spacer layer away from the substrate, and includes a touch trace at least disposed in the wire replacement region, wherein the touch trace is electrically connected to the first metal trace in the wire replacement region;

wherein the inorganic encapsulation sub-layer does not overlap with the wire replacement region.

In one embodiment of this disclosure, the display panel further includes a bank structure, which is disposed on the substrate and in the non-display region and disposed between the wire replacement region and the display region; wherein both the inorganic encapsulation sub-layer and the spacer layer cover the bank structure, and extend from the bank structure in a direction away from the display region.

In one embodiment of this disclosure, on one side of the bank structure away from the display region, a thickness of the inorganic encapsulation sub-layer close to the bank structure is greater than a thickness of the inorganic encapsulation sub-layer away from the bank structure.

In one embodiment of this disclosure, boundaries of both the inorganic encapsulation sub-layer and the spacer layer in the non-display region are disposed between the bank structure and the wire replacement region.

In one embodiment of this disclosure, the inorganic encapsulation sub-layer is provided with a first opening in the wire replacement region; and the spacer layer is provided with a second opening corresponding to the first opening, and the touch trace is electrically connected to the first metal trace through the first opening and the second opening.

In one embodiment of this disclosure, the spacer layer is further disposed on a sidewall of the first opening, and a size of the second opening is less than a size of the first opening.

In one embodiment of this disclosure, the thin film transistor layer is provided with a third opening in the wire replacement region, the inorganic encapsulation sub-layer is further disposed on a sidewall of the third opening, a size of the first opening is less than a size of the third opening, and the touch trace is electrically connected to the first metal trace through the first opening, the second opening and the third opening.

In one embodiment of this disclosure, the encapsulation layer includes a first inorganic encapsulation sub-layer, an organic encapsulation sub-layer and a second inorganic encapsulation sub-layer arranged in a stacked manner, and the inorganic encapsulation sub-layer includes the first inorganic encapsulation sub-layer and the second inorganic encapsulation sub-layer.

In one embodiment of this disclosure, a material of the spacer layer includes at least one of silicon oxide or silicon nitride.

In one embodiment of this disclosure, the spacer layer does not overlap with the wire replacement region.

Beneficial Effects

Compared to the existing technology, this disclosure is configured to form the spacer layer on one side of the encapsulation layer, so that a thickness of the film layer above the first metal trace can be increased as compared with the prior art, wherein the thickness thereof includes a thickness of the inorganic encapsulation sub-layer and a thickness of the spacer layer. In addition, a material of the spacer layer can be an inorganic material, so that the inorganic encapsulation sub-layer and optionally the spacer layer in the wire replacement region can be etched to form openings in the manufacturing process, and the wire replacing and bridging between the touch trace and the first metal trace in the wire replacement region can be implemented. Thus, the position of the wire replacement region can be configured to be closer to the display region according to this disclosure without the need of considering the phenomenon of the poor contact caused by the reason that the inorganic encapsulation sub-layer extends into the wire replacement region, and thus has the thickness that is too thin to be effectively etched. Further, the distance between the wire replacement region and the display region is decreased, a bezel width of the display panel is decreased, and a narrow bezel display panel can be implemented.

DESCRIPTION OF DRAWINGS

The technical solutions and other beneficial effects of this disclosure will become obvious by describing the specific implementation embodiments of this disclosure in detail below in conjunction with the accompanying drawings.

DETAILED DESCRIPTION OF EMBODIMENTS

Figure 1:
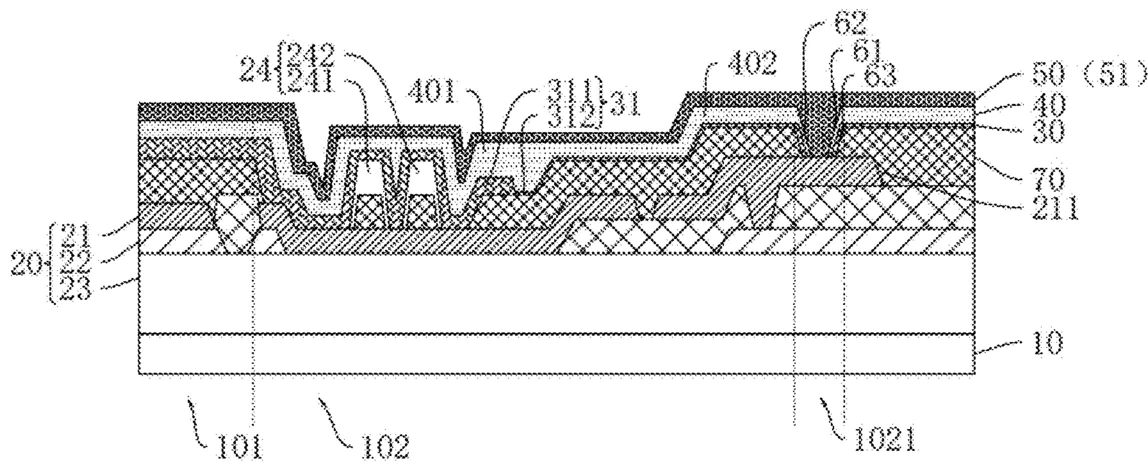
FIG. 1 is a cross-sectional schematic structure view showing a display panel provided by an embodiment of this disclosure.

The technical solutions in the embodiments of this disclosure will be clearly and completely described in the following with reference to the drawings of the embodiments of this disclosure. Obviously, the described embodiments are only a part of the embodiments of this disclosure, rather than all the embodiments. Based on the embodiments of this disclosure, all other embodiments obtained by those skilled in the art without creative works are deemed as falling within the scope of this disclosure.

The following disclosure provides many different implementations or examples for realizing different structures of this disclosure. In order to simplify the contents of this disclosure, the components and configurations of specific examples are described hereinafter. Of course, they are only examples, and are not intended to limit this disclosure. In addition, reference digits and/or reference characters may be repeated in different examples of this disclosure, and such the repetition is for the purpose of simplification and clarity, and does not in itself indicate the relationship between the various embodiments and/or configurations discussed. In addition, this disclosure provides examples of various specific processes and materials, but those of ordinary skill in the art may be aware of the application of other processes and/or the use of other materials.

An embodiment of this disclosure provides a display panel. Referring to FIG. 1, the display panel includes a display region 101 and a non-display region 102 disposed on at least one side of the display region 101, and the non-display region 102 includes a wire replacement region 1021.

The display panel further includes a substrate 10, a thin film transistor layer 20, an encapsulation layer 30, a spacer layer 40 and a touch metal layer 50. By way of example and not limitation, the spacer layer 40 may be an inorganic spacer layer. Nevertheless, the space layer 40 may also be an organic spacer layer, which could be readily appreciated by the skilled person in the art. That is, a material of the spacer layer 40 may be an inorganic material or an organic material, which materials may be any suitable type of state-of-the-art inorganic or organic material known by the skilled person in the art. Note that when reference is made hereinafter to the inorganic spacer layer 40, it refers to the spacer layer 40, and that the inorganic spacer layer 40 may be replaced by an organic spacer layer 40, mutatis mutandis, without deviating from the scope of the present disclosure.

The thin film transistor layer 20 is disposed on the substrate 10 and includes a first metal layer 21. The first metal layer 21 includes a first metal trace 211 at least disposed in the wire replacement region 1021. The encapsulation layer 30 is disposed on one side of the thin film transistor layer 20 away from the substrate 10, and includes an inorganic encapsulation sub-layer 31. The inorganic spacer layer 40 and the inorganic encapsulation sub-layer 31 are stacked on one side of the thin film transistor layer 20 away from the substrate 10. The touch metal layer 50 is disposed on the inorganic encapsulation sub-layer 31 and one side of the inorganic spacer layer 40 away from the substrate 10, and includes a touch trace 51 at least disposed in the wire replacement region 1021. The touch trace 51 is electrically connected to the first metal trace 211 in the wire replacement region 1021.

Further, the inorganic encapsulation sub-layer 31 does not overlap with the wire replacement region 1021. In an example, in addition to the inorganic encapsulation sub-layer 31 being not overlapped with the wire replacement region 1021, the spacer layer 40 does not overlap with the wire replacement region 1021.

In an implementation application process, the embodiment of this disclosure is configured to provide the inorganic spacer layer 40 stacked with the inorganic encapsulation sub-layer 31 in the display panel, so that the thickness of the inorganic film layer in the wire replacement region 1021 can be increased, that the inorganic encapsulation sub-layer 31 and the inorganic spacer layer 40 disposed in the wire replacement region 1021 can be synchronously removed in the manufacturing process, and that the wire replacing and bridging between the touch trace 51 and the first metal trace 211 in the wire replacement region 1021 can be implemented. Thus, the wire replacement region 1021 can be disposed at a position closer to the display region 101 according to this disclosure without the need of considering the phenomenon of the poor contact caused by the reason that the inorganic encapsulation sub-layer 31 extends into the wire replacement region 1021, and thus has the thickness that is too thin to be effectively etched. Further, the distance between the wire replacement region 1021 and the display region 101 is decreased, a bezel width of the display panel is decreased, and a narrow bezel display panel can be implemented.

Specifically, the structure of the display panel provided by the embodiment of this disclosure will be described in detail according to the following specific embodiment.

Figure 2:
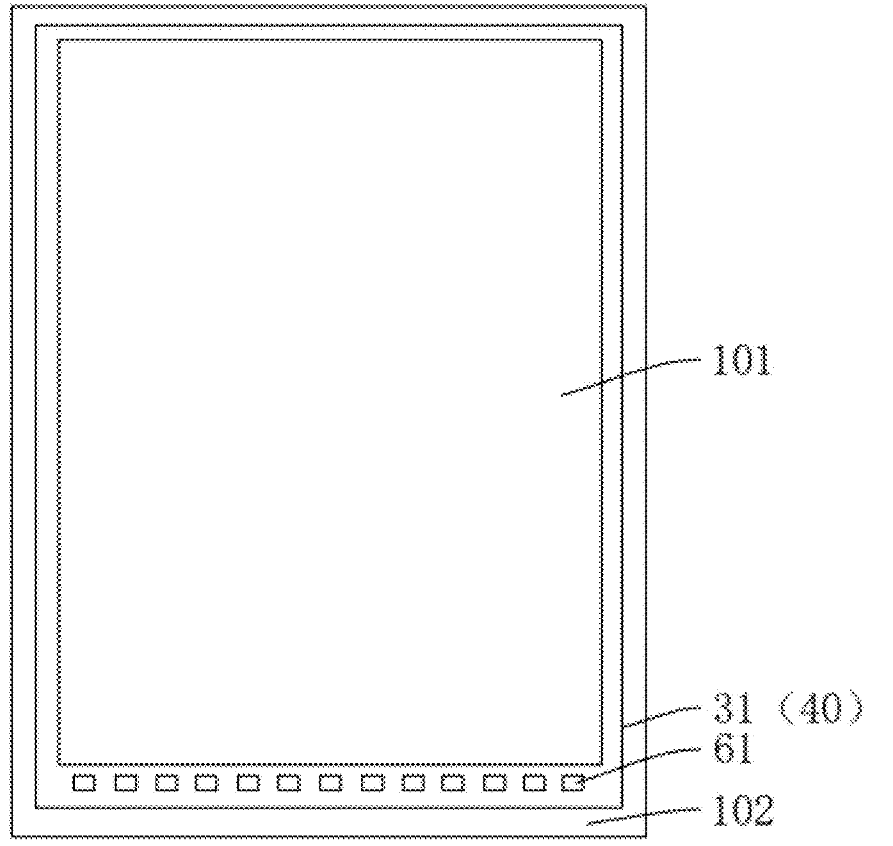
FIG. 2 is a top schematic structure view showing the display panel provided by the embodiment of this disclosure.

Referring to FIGS. 1 and 2, the display panel in one embodiment of this disclosure includes the display region 101 and the non-display region 102. It is to be described that the non-display region 102 located at the bottom end of the display panel is taken as an example for explanation in the embodiment of this disclosure. In addition, the non-display region 102 includes the wire replacement region 1021 and a bending bonding region (not shown in the drawing) disposed on one side of the wire replacement region 1021 away from the display region 101.

The display panel further includes the substrate 10, the thin film transistor layer 20 disposed on the substrate 10, the encapsulation layer 30 disposed on the thin film transistor layer 20, the inorganic spacer layer 40 disposed on the encapsulation layer 30 and the touch metal layer 50 disposed on the inorganic spacer layer 40.

The thin film transistor layer 20 includes a thin film transistor device and an insulating layer covering the thin film transistor device, and may specifically include the first metal layer 21, a second metal layer 22 and an insulating layer 23. Further, the first metal layer 21 may include devices such as a source, a drain and a data line and the like, the second metal layer 22 may include devices such as a gate, a gate line and the like, and the insulating layer 23 may include insulating sub-layers located between the above-mentioned devices.

It is to be described that in the cross-section structure diagram of the display panel provided by the embodiment of this disclosure, only the structure of one side of the display panel near the non-display region is shown, and the drawing may show that the thin film transistor layer 20 includes the above-mentioned film layer but is not limited to the above-mentioned film layer. In addition, the stacking configuration of the first metal layer 21, the second metal layer 22 and the insulating layer 23 in the drawing only corresponds to the structure near one side of the non-display region 102, and the stacking configuration of the first metal layer 21, the second metal layer 22 and the insulating layer 23 in the display region 101 may be configured according to the thin film transistor array structure in the conventional OLED display panel, so no restriction is made thereto.

In this embodiment, the first metal layer 21 includes the source, the drain, the data line and the like disposed in the display region 101, and the first metal layer 21 further includes the first metal trace 211 at least disposed in the wire replacement region 1021.

In addition, the thin film transistor layer 20 further includes an interlayer insulating layer 70 disposed on one side of the first metal layer 21 away from the substrate 10. The interlayer insulating layer 70 has: a part, which is disposed in the display region 101 and may be used as a planarization layer; an edge, which is disposed in the non-display region 102 and may also be used as a part of elevating a bank structure 24; and another part, which is disposed in the wire replacement region 1021 and may also function as an insulating layer for covering the first metal trace 211.

It is to be described that the display panel further includes a pixel definition layer (not shown in the drawing) disposed on the interlayer insulating layer 70, and the pixel definition layer is formed with multiple pixel openings in the display region 101, wherein each pixel opening is formed with a light-emitting unit. The pixel definition layer is further stacked with the interlayer insulating layer 70 in the non-display region 102 to form the bank structure 24, and the bank structure 24 is disposed between the display region 101 and the wire replacement region 1021.

Specifically, the bank structure 24 includes a first bank 241 disposed near one side of the display region 101, and a second bank 242 disposed on one side of the first bank 241 away from the display region 101.

The encapsulation layer 30 is disposed on one side of the thin film transistor layer 20 away from the substrate 10, and includes the inorganic encapsulation sub-layer 31. It is to be described that the encapsulation layer 30 provided by the embodiment of this disclosure may be a stacked structure of an organic layer and an inorganic layer, or a stacked structure of an inorganic layer, an organic layer and an inorganic layer. For example, the encapsulation layer 30 includes the first inorganic encapsulation sub-layer, the organic encapsulation sub-layer and the second inorganic encapsulation sub-layer, wherein the organic encapsulation sub-layer is blocked by the bank structure 24, and the first inorganic encapsulation sub-layer and the second inorganic encapsulation sub-layer extend to the non-display region 102 to enhance the package effect. The inorganic encapsulation sub-layer 31 in the embodiment of this disclosure includes the first inorganic encapsulation sub-layer and the second inorganic encapsulation sub-layer. In the drawings provided by the embodiment of this disclosure, only the inorganic encapsulation sub-layer 31 extending to an edge of the display region 101 and in the non-display region 102 is shown as an example for explanation.

Further, on one side of the bank structure 24 away from the display region 101, a thickness of the inorganic encapsulation sub-layer 31 close to the bank structure 24 is greater than a thickness of the inorganic encapsulation sub-layer 31 away from the bank structure 24.

Specifically, the inorganic encapsulation sub-layer 31 includes a first inorganic encapsulation part 311 located in the display region 101, and a second inorganic encapsulation part 312 connected to the first inorganic encapsulation part 311 and located on one side of the bank structure 24 away from the display region 101. Specifically, the first inorganic encapsulation part 311 may cover the display region 101 and extend to one side of the bank structure 24 away from the display region 101, and the second inorganic encapsulation part 312 is connected to the first inorganic encapsulation part 311, and extends toward one side of the bank structure 24 away from the display region 101 to cover the wire replacement region 1021. Because the inorganic encapsulation sub-layer 31 is frequently prepared by using the chemical vapor deposition in the manufacturing process, the thickness of the inorganic encapsulation sub-layer 31 in the marginal region decreases slowly. That is, the thickness of the second inorganic encapsulation part 312 on one side of the bank structure 24 away from the display region 101 becomes thinner. That is, the thickness of the second inorganic encapsulation part 312 is less than the thickness of the first inorganic encapsulation part 311.

The inorganic spacer layer 40 is disposed on one side of the encapsulation layer 30 away from the substrate 10, and the inorganic spacer layer 40 and the inorganic encapsulation sub-layer 31 are stacked. Specifically, the inorganic spacer layer 40 and the second inorganic encapsulation part 312 are stacked in the non-display region 102, and disposed on the interlayer insulating layer 70.

Further, the inorganic spacer layer 40 includes a first inorganic spacer portion 401 correspondingly disposed on the first inorganic encapsulation part 311, and a second inorganic spacer portion 402 correspondingly disposed on the second inorganic encapsulation part 312. Herein, it should be understood that under the condition that the inorganic spacer layer 40 is replaced by an organic spacer layer 40, the organic spacer layer 40 may include a first organic spacer portion 401 correspondingly disposed on the first inorganic encapsulation part 311, and a second organic spacer portion 402 correspondingly disposed on the second inorganic encapsulation part 312, mutatis mutandis, without deviating from the scope of the present disclosure.

Optionally, materials of the inorganic spacer layer 40 and the inorganic encapsulation sub-layer 31 may include at least one of silicon oxide or silicon nitride.

In this embodiment, the display panel further includes openings disposed in the wire replacement region 1021, the inorganic encapsulation sub-layer 31 is provided with a first opening 61 in the wire replacement region 1021, the inorganic spacer layer 40 is provided with a second opening 62 in the wire replacement region 1021, and the thin film transistor layer 20 is provided with a third opening 63 in the wire replacement region 1021.

Specifically, the second inorganic encapsulation part 312 is provided with the first opening 61 in the wire replacement region 1021, the second inorganic spacer portion 402 is provided with the second opening 62 in the wire replacement region 1021, and the interlayer insulating layer 70 is provided with the third opening 63 in the wire replacement region 1021 to expose the first metal trace 211 at least disposed in the wire replacement region 1021.

The inorganic spacer layer 40 is further disposed on a sidewall of the first opening 61, and a size of the second opening 62 is less than a size of the first opening 61. The inorganic encapsulation sub-layer 31 is further disposed on a sidewall of the third opening 63, and the size of the first opening 61 is less than a size of the third opening 63.

The display panel provided by the embodiment of this disclosure may be used in a touch display panel. That is, the touch metal layer 50 includes multiple touch electrodes located in the display region 101 and separately distributed, and touch traces 51 connected to the touch electrodes. The touch trace 51 extends to the wire replacement region 1021 and passes through the first opening 61, the second opening 62 and the third opening 63 to bridge with the first metal trace 211. That is, wire replacement of each touch electrode is implemented in the wire replacement region 1021 through the touch trace 51, each touch electrode is electrically connected to the first metal trace 211, and the first metal trace 211 extends to the bending bonding region to implement the bonding connection with a circuit board and to implement the transmission of the electrical signal from the circuit board to each touch electrode through the first metal trace 211 and the touch trace 51.

As mentioned hereinabove, the embodiment of this disclosure is configured to form the inorganic spacer layer 40 on one side of the encapsulation layer 30 away from the substrate to increase the thickness of the inorganic film layer on the interlayer insulating layer 70 and in the wire replacement region 1021, so that it is beneficial to the removing of the inorganic encapsulation sub-layer 31 and the inorganic spacer layer 40 in the wire replacement region 1021 at a time in the etching process, and that the wire replacing and bridging between the touch trace 51 and the first metal trace 211 can be implemented through the wire replacement region 1021. Accordingly, this disclosure can be configured such that the wire replacement region 1021 is located at a position closer to the display region 101 without the need of considering the phenomenon of the poor contact caused by the reason that the inorganic encapsulation sub-layer 31 extends into the wire replacement region 1021, and thus has the thickness that is too thin to be effectively etched. Further, the distance between the wire replacement region 1021 and the display region 101 can be decreased, a bezel width of the display panel can be decreased, and a narrow bezel display panel can be implemented.

Figure 3:
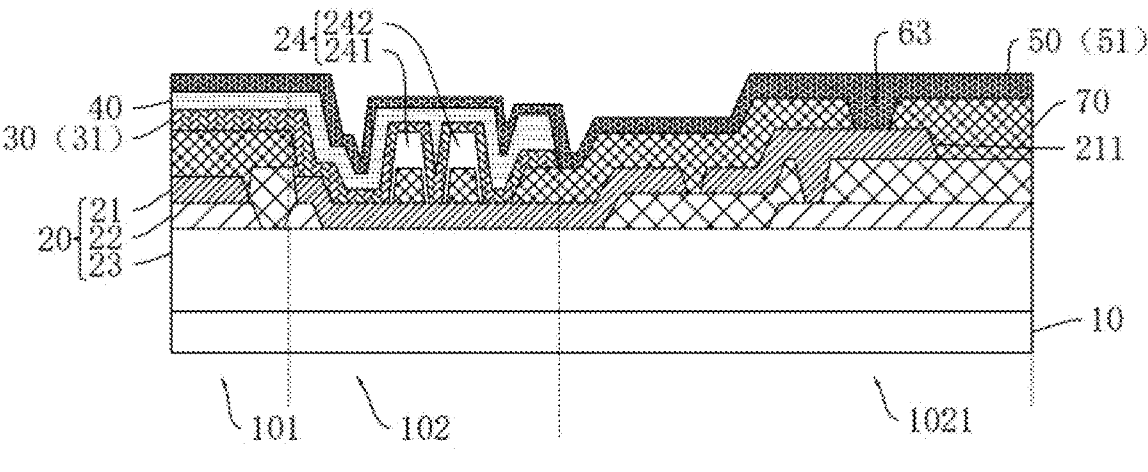
FIG. 3 is another cross-sectional schematic structure view showing the display panel provided by the embodiment of this disclosure.
Figure 4:
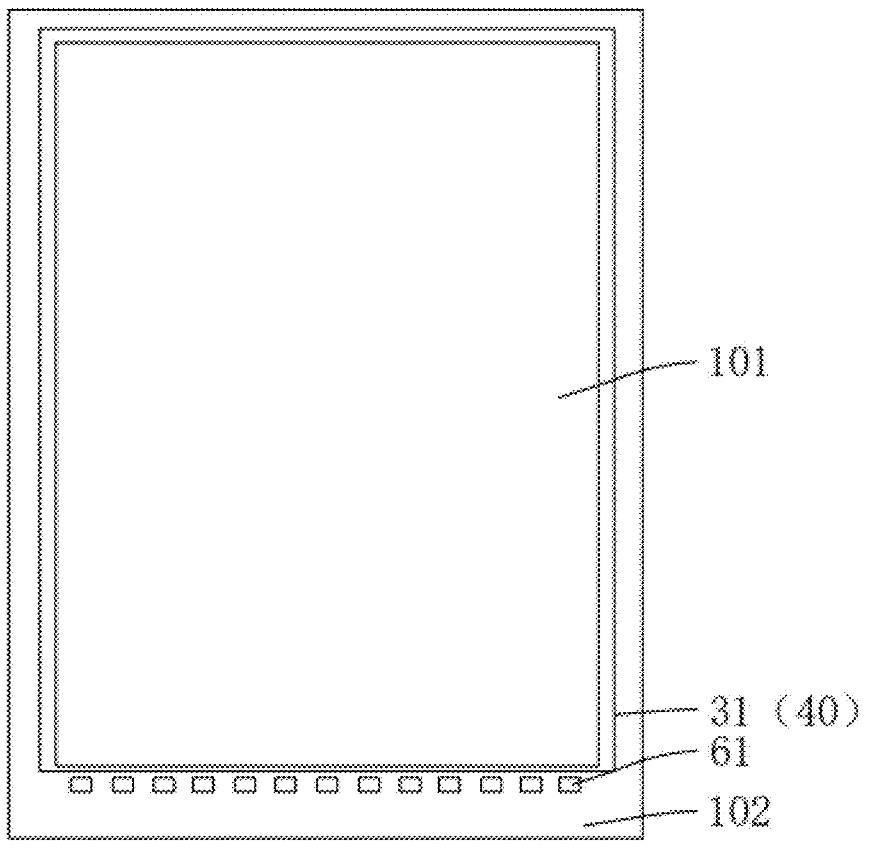
FIG. 4 is another top schematic structure view showing the display panel provided by the embodiment of this disclosure.

Referring to FIGS. 3 and 4, the difference between another embodiment and the above-mentioned embodiment resides in the placement range of the wire replacement region 1021. In this embodiment, boundaries of both the inorganic encapsulation sub-layer 31 and the inorganic spacer layer 40 in the non-display region 102 are disposed between the bank structure 24 and the wire replacement region 1021.

Specifically, the inorganic encapsulation sub-layer 31 and the inorganic spacer layer 40 in the wire replacement region 1021 may be removed. Further, the thickness of the inorganic encapsulation sub-layer 31 on one side of the bank structure 24 away from the display region 101 decreases slowly. In this embodiment, it is possible to remove a part of the inorganic encapsulation sub-layer 31, which is disposed on one side of the bank structure 24 away from the display region 101 and has a thinned thickness, and the inorganic spacer layer 40 corresponding to the part of the inorganic encapsulation sub-layer 31 to expose a partial upper surface of the interlayer insulating layer 70 in the wire replacement region 1021.

In this embodiment, the interlayer insulating layer 70 is provided with the third opening 63 located in the wire replacement region 1021, and the touch trace 51 is electrically connected to the first metal trace 211 through the third opening 63.

As mentioned hereinabove, the embodiment of this disclosure is configured to form the inorganic spacer layer 40 on one side of the encapsulation layer 30 away from the substrate to increase the thickness of the inorganic film layer on the interlayer insulating layer 70 and in the wire replacement region 1021. Thus, it is beneficial to the removing of the inorganic encapsulation sub-layer 31 and the inorganic spacer layer 40 in the wire replacement region 1021 at a time in the etching process, and wire replacing and bridging between the touch trace 51 and the first metal trace 211 can be implemented in the wire replacement region 1021. Accordingly, this disclosure can be configured such that the wire replacement region 1021 is located at a position closer to the display region 101 without the need of considering the phenomenon of the poor contact caused by the reason that the inorganic encapsulation sub-layer 31 extends into the wire replacement region 1021, and thus has the thickness that is too thin to be effectively etched. Further, the distance between the wire replacement region 1021 and the display region 101 can be decreased, a bezel width of the display panel can be decreased, and a narrow bezel display panel can be implemented. In addition, the area of the inorganic film layer being removed is larger in this embodiment. Compared with the previous embodiment, the requirement on the etching accuracy is lower, and the thickness of the film layer in the non-display region 102 can be decreased. When the non-display region 102 of the display panel needs to be bent, the bending performance of the non-display region 102 of the display panel may be enhanced.

Figure 5:
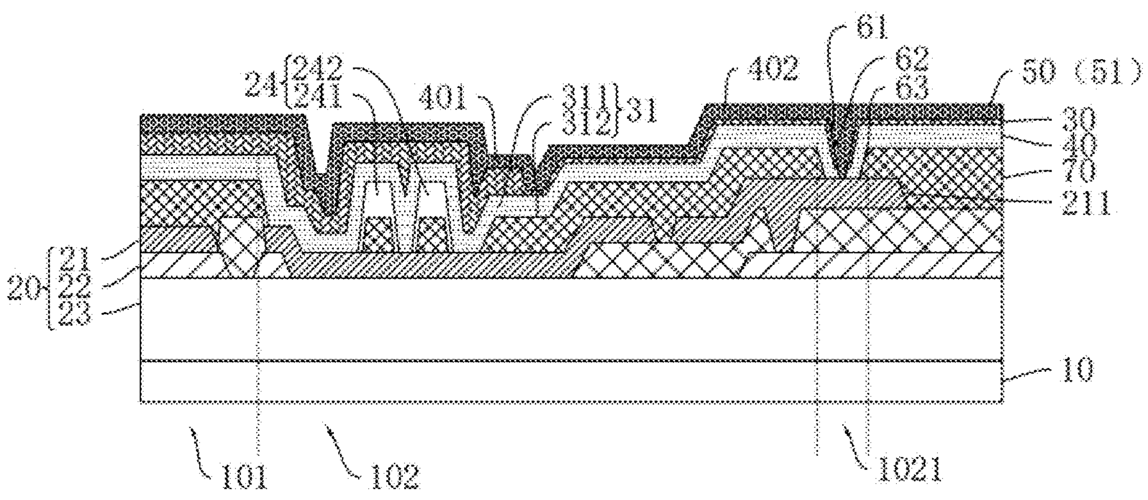
FIG. 5 is another cross-sectional schematic structure view showing the display panel provided by the embodiment of this disclosure.

Referring to FIG. 5, the difference between another embodiment and the first embodiment resides in that the inorganic spacer layer 40 is disposed on one side of the encapsulation layer 30 near the substrate 10. That is, the inorganic spacer layer 40 is disposed between the encapsulation layer 30 and the interlayer insulating layer 70.

In this embodiment, the inorganic encapsulation sub-layer 31 is provided with a first opening 61 in the wire replacement region 1021, the inorganic spacer layer 40 is provided with a second opening 62 in the wire replacement region 1021, and the interlayer insulating layer 70 is provided with a third opening 63 in the wire replacement region 1021.

The inorganic encapsulation sub-layer 31 is further disposed on a sidewall of the second opening 62, and a size of the first opening 61 is less than a size of the second opening 62. The inorganic spacer layer 40 is further disposed on a sidewall of the third opening 63, and the size of the second opening 62 is less than a size of the third opening 63.

As mentioned hereinabove, the embodiment of this disclosure is configured to form the inorganic spacer layer 40 on one side of the encapsulation layer 30 away from the substrate to increase the thickness of the inorganic film layer on the interlayer insulating layer 70 and in the wire replacement region 1021, so that it is beneficial to the removing of the inorganic encapsulation sub-layer 31 and the inorganic spacer layer 40 in the wire replacement region 1021 at a time in the etching process, and that the wire replacing and bridging between the touch trace 51 and the first metal trace 211 can be implemented through the wire replacement region 1021. Accordingly, this disclosure can be configured such that the wire replacement region 1021 is located at a position closer the display region 101 without the need of considering the phenomenon of the poor contact caused by the reason that the inorganic encapsulation sub-layer 31 extends into the wire replacement region 1021, and thus has the thickness that is too thin to be effectively etched. Further, the distance between the wire replacement region 1021 and the display region 101 can be decreased, a bezel width of the display panel can be decreased, and a narrow bezel display panel can be implemented.

Figure 6:
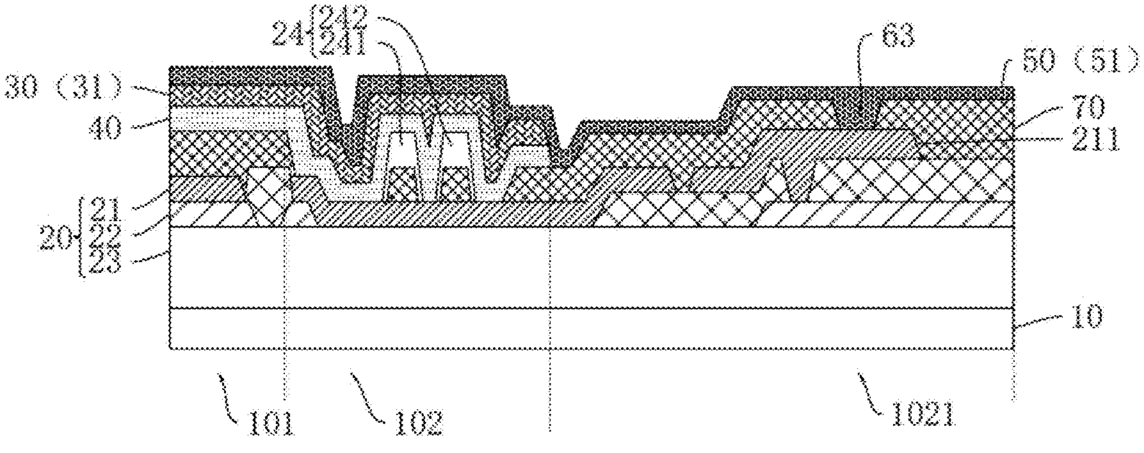
FIG. 6 is another cross-sectional schematic structure view showing the display panel provided by the embodiment of this disclosure.

Referring to FIG. 6, the difference between another embodiment and the second embodiment resides in that the inorganic spacer layer 40 is disposed on one side of the encapsulation layer 30 near the substrate 10. That is, the inorganic spacer layer 40 is disposed between the encapsulation layer 30 and the interlayer insulating layer 70.

In this embodiment, boundaries of both the inorganic encapsulation sub-layer 31 and the inorganic spacer layer 40 in the non-display region 102 are disposed between the bank structure 24 and the wire replacement region 1021.

As mentioned hereinabove, the embodiment of this disclosure is configured to form the inorganic spacer layer 40 on one side of the encapsulation layer 30 away from the substrate to increase the thickness of the inorganic film layer on the interlayer insulating layer 70 and in the wire replacement region 1021, so that it is beneficial to the removing of the inorganic encapsulation sub-layer 31 and the inorganic spacer layer 40 in the wire replacement region 1021 at a time in the etching process, and that the wire replacing and bridging between the touch trace 51 and the first metal trace 211 can be implemented through the wire replacement region 1021. Accordingly, this disclosure can be configured such that the wire replacement region 1021 is located at a position closer the display region 101 without the need of considering the phenomenon of the poor contact caused by the reason that the inorganic encapsulation sub-layer 31 extends into the wire replacement region 1021, and thus has the thickness that is too thin to be effectively etched. Further, the distance between the wire replacement region 1021 and the display region 101 can be decreased, a bezel width of the display panel can be decreased, and a narrow bezel display panel can be implemented. In addition, the area of the inorganic film layer being removed is larger in this embodiment. Compared with the previous embodiment, the requirement on the etching accuracy is lower, and the thickness of the film layer in the non-display region 102 can be decreased. When the non-display region 102 of the display panel needs to be bent, the bending performance of the non-display region 102 of the display panel may be enhanced.

Figure 7:
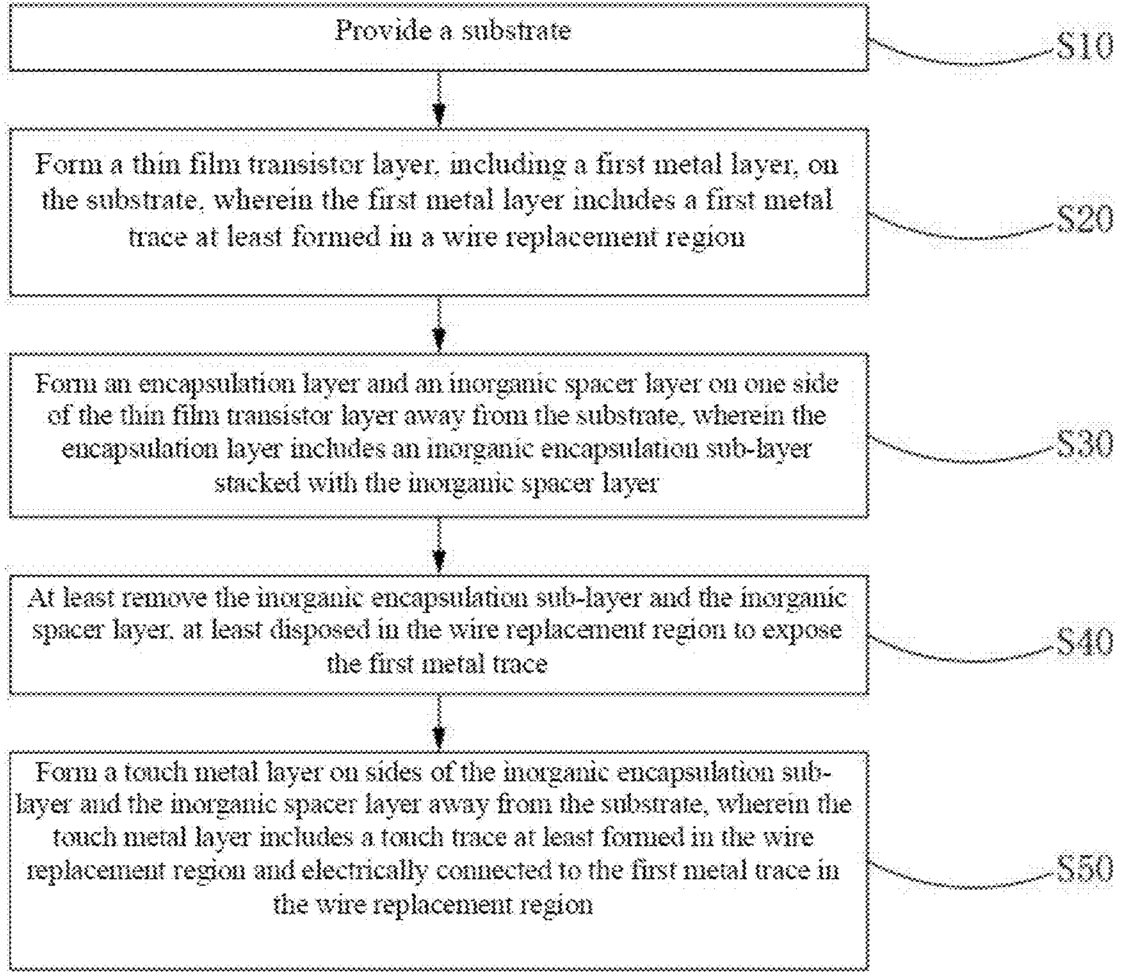
FIG. 7 is a flow chart showing a manufacturing method of the display panel provided by the embodiment of this disclosure.
Figure 8A:
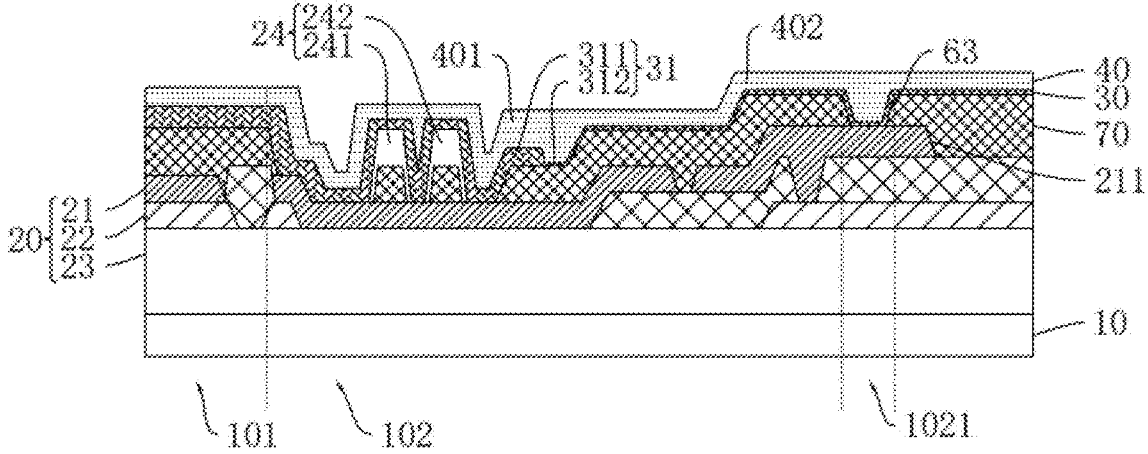
FIGS. 8*a* to 8*d* are structure diagrams showing the display panel provided by the embodiment of this disclosure in a production process.
Figure 8B:
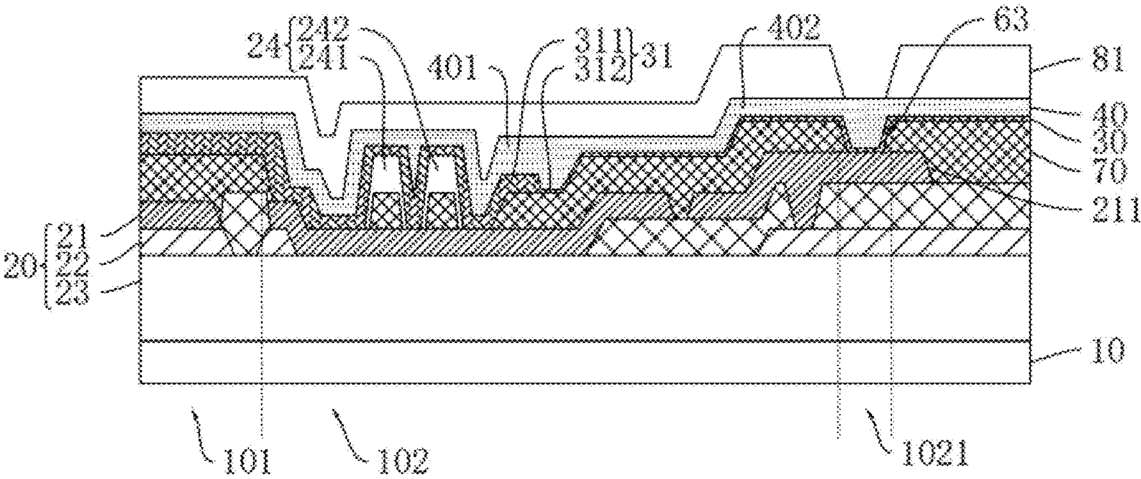
Figure 8C:
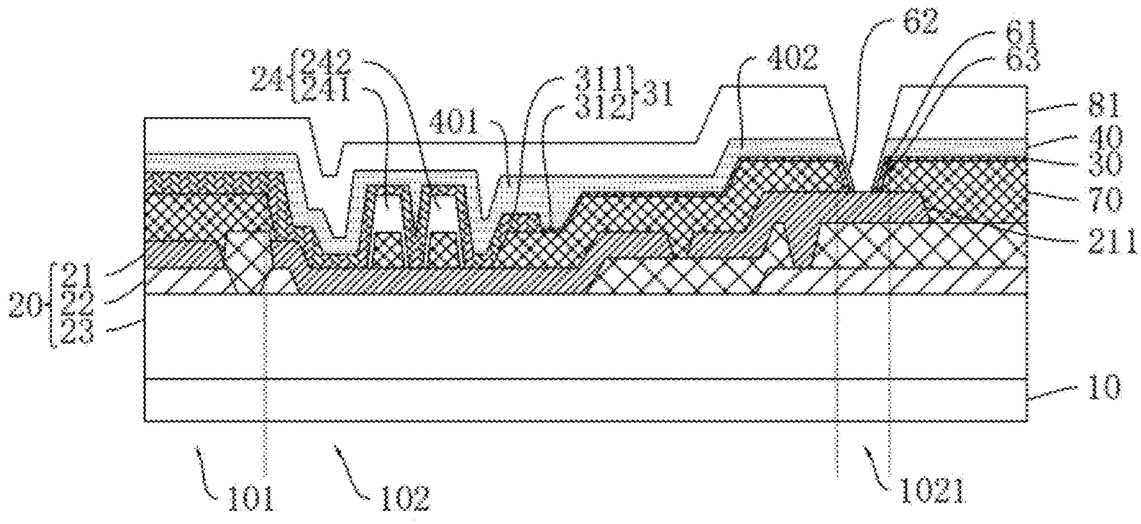
Figure 8D:
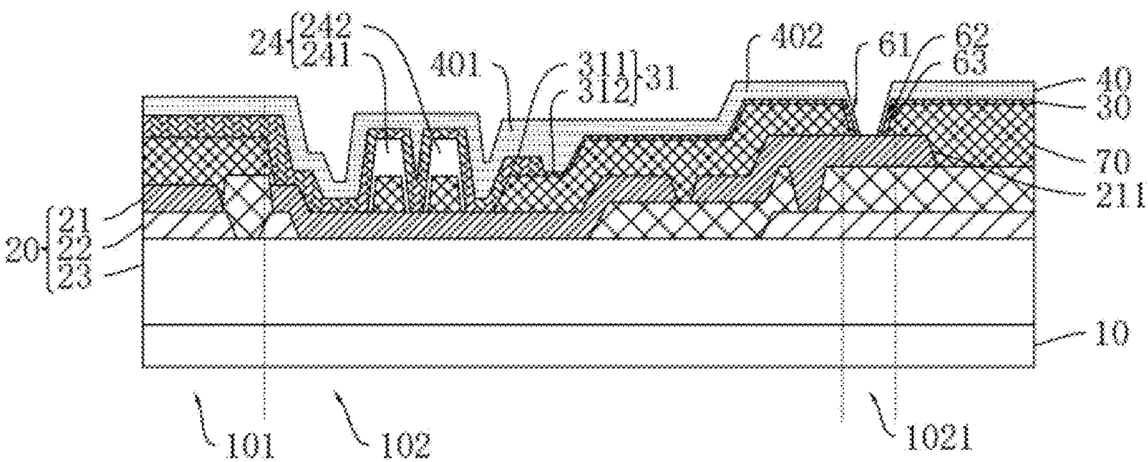
Figure 9A:
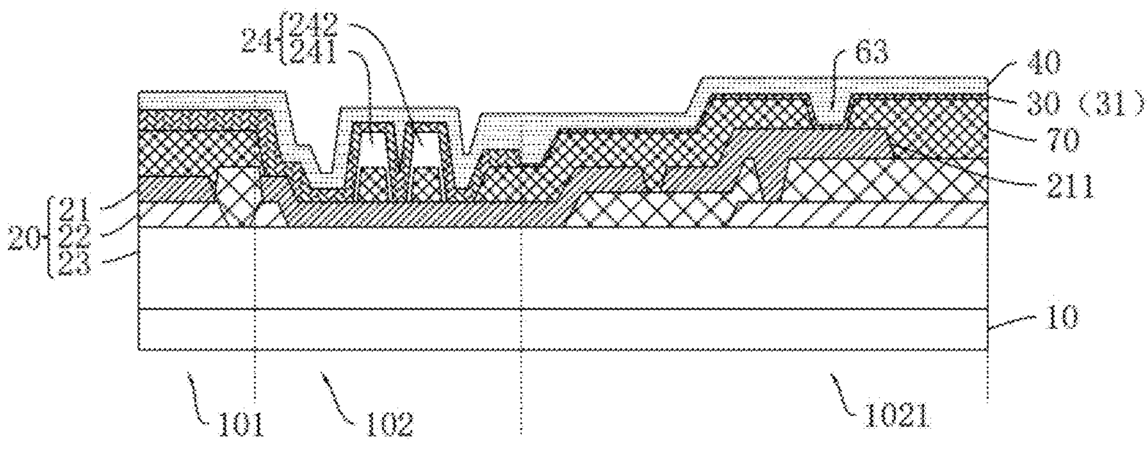
FIGS. 9*a* to 9*d* are structure diagrams showing the display panel provided by the embodiment of this disclosure in another production process.
Figure 9B:
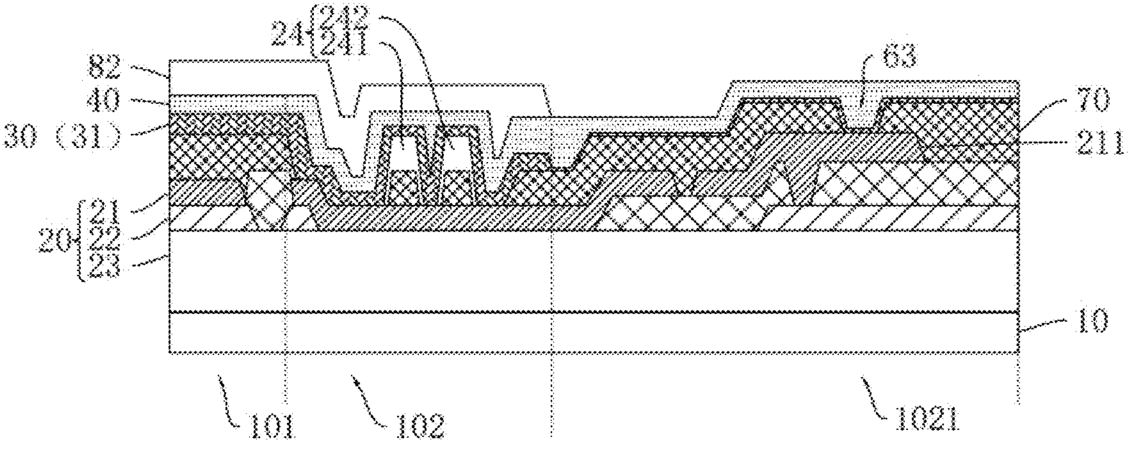
Figure 9C:
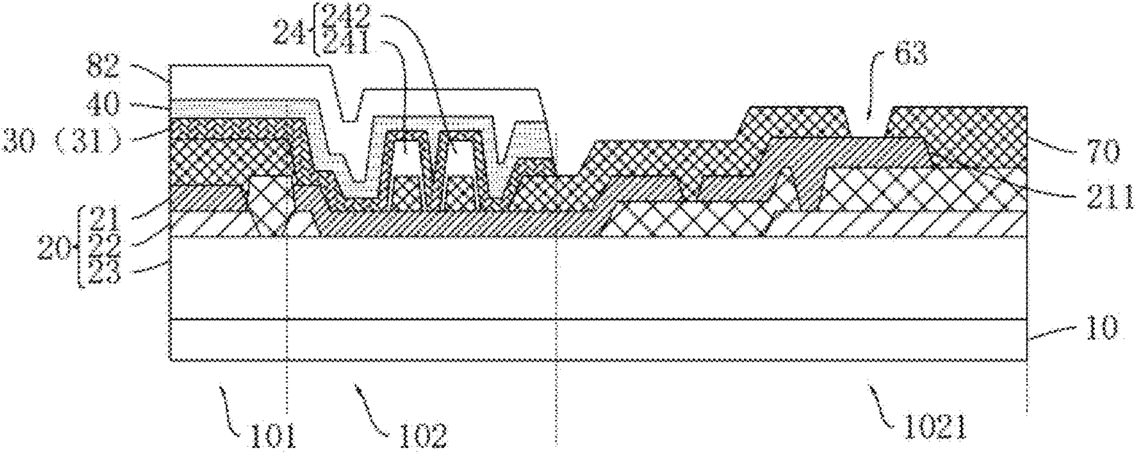
Figure 9D:
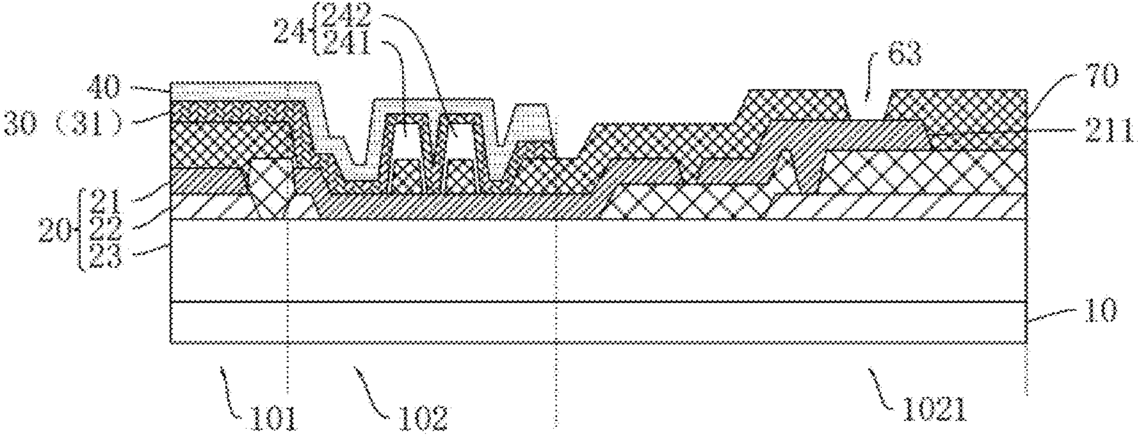

In addition, the embodiment of this disclosure further provides a manufacturing method of a display panel, and the display panel is one of the display panels mentioned in the above-mentioned embodiments. The display panel includes a display region 101 and a non-display region 102 disposed on at least one side of the display region 101, and the non-display region 102 includes a wire replacement region 1021. Referring to FIGS. 1 and 7, the manufacturing method of the display panel includes the following steps S10 to S50.

In the step S10, a substrate 10 is provided.

In the step S20, a thin film transistor layer 20 is formed on the substrate 10, wherein the thin film transistor layer 20 includes a first metal layer 21, and the first metal layer 21 includes a first metal trace 211 at least formed in the wire replacement region 1021.

In the step S30, an encapsulation layer 30 and an inorganic spacer layer 40 are formed on one side of the thin film transistor layer 20 away from the substrate 10, wherein the encapsulation layer 30 includes an inorganic encapsulation sub-layer 31 stacked with the inorganic spacer layer 40.

In the step S40, the inorganic encapsulation sub-layer 31 and the inorganic spacer layer 40 disposed in the wire replacement region 1021 are at least removed to expose the first metal trace 211.

In the step S50, a touch metal layer 50 is formed on the inorganic encapsulation sub-layer 31 and one side of the inorganic spacer layer 40 away from the substrate 10, wherein the touch metal layer 50 includes a touch trace 51 at least formed in the wire replacement region 1021, and the touch trace 51 is electrically connected to the first metal trace 211 in the wire replacement region 1021.

Specifically, referring to FIGS. 1, 2, 7 and 8*a* to 8*d*, the manufacturing method of the display panel in one embodiment of this disclosure includes the following steps.

The substrate 10 is provided.

The thin film transistor layer 20 is formed on the substrate 10, and includes the first metal layer 21, the second metal layer 22 and the insulating layer 23. Further, the first metal layer 21 may include devices such as a source, a drain and a data line and the like, the second metal layer 22 may include devices such as a gate, a gate line and the like, and the insulating layer 23 may include insulating sub-layers located between the above-mentioned devices.

It is to be described that in the cross-section structure diagram of the display panel provided by the embodiment of this disclosure, only the structure of one side of the display panel near the non-display region 102 is shown, and the drawing may show that the thin film transistor layer 20 includes the above-mentioned film layer but is not limited to the above-mentioned film layer. In addition, the stacking configuration of the first metal layer 21, the second metal layer 22 and the insulating layer 23 in the drawing only corresponds to the structure near one side of the non-display region 102, and the stacking configuration of the first metal layer 21, the second metal layer 22 and the insulating layer 23 in the display region 101 may be configured according to the thin film transistor array structure in the conventional OLED display panel, so no restriction is made thereto.

In this embodiment, the first metal layer 21 includes the source, the drain, the data line and the like disposed in the display region 101, and the first metal layer 21 further includes the first metal trace 211 disposed in the wire replacement region 1021.

The thin film transistor layer 20 further includes an interlayer insulating layer 70 disposed on one side of the first metal layer 21 away from the substrate 10, and a material of the interlayer insulating layer 70 includes an organic material. A part of the interlayer insulating layer 70 in the display region 101 may be used as a planarization layer, and may function as an insulating layer in the wire replacement region 1021 to cover the first metal trace 211.

Thereafter, a pixel definition layer (not shown in the drawing) is formed on one side of the interlayer insulating layer 70 away from the substrate 10, and the pixel definition layer is formed with multiple pixel openings in the display region 101. Each pixel opening is formed with a light-emitting unit, and the pixel definition layer is further stacked with the interlayer insulating layer 70 in the non-display region 102 to form a bank structure 24, which specifically includes a first bank 241 disposed near one side of the display region 101 and a second bank 242 disposed on one side of the first bank 241 away from the display region 101.

Next, a third opening 63 is formed on a part of the interlayer insulating layer 70 and in the wire replacement region 1021 to expose a partial upper surface of the first metal trace 211.

The encapsulation layer 30 is formed on one side of the interlayer insulating layer 70 away from the substrate 10, and includes the inorganic encapsulation sub-layer 31. The inorganic encapsulation sub-layer 31 includes a first inorganic encapsulation part 311 located in the display region 101, and a second inorganic encapsulation part 312 connected to the first inorganic encapsulation part 311 and located on one side of the bank structure 24 away from the display region 101. Specifically, the first inorganic encapsulation part 311 may cover the display region 101 and extend to one side of the bank structure 24 away from the display region 101, and the second inorganic encapsulation part 312 is connected to the first inorganic encapsulation part 311, and extends toward one side of the bank structure 24 away from the display region 101 to cover the wire replacement region 1021. Because the inorganic encapsulation sub-layer 31 may be prepared by using the chemical vapor deposition, the thickness of the inorganic encapsulation sub-layer 31 at the edge decreases, and the thickness of the second inorganic encapsulation part 312 is less than the thickness of the first inorganic encapsulation part 311.

The second inorganic encapsulation part 312 further covers a bottom and a sidewall of the third opening 63.

The inorganic spacer layer 40 is formed on one side of the encapsulation layer 30 away from the substrate 10, and includes a first inorganic spacer portion 401 correspondingly disposed on the first inorganic encapsulation part 311, and a second inorganic spacer portion 402 correspondingly disposed on the second inorganic encapsulation part 312.

The second inorganic spacer portion 402 further covers the bottom and the sidewall of the third opening 63. That is, the second inorganic spacer portion 402 covers the second inorganic encapsulation part 312.

Optionally, a material of the inorganic spacer portion 401/402 includes at least one of silicon oxide or silicon nitride.

A photoresist 81 is coated on the inorganic spacer layer 401/402 with an opening corresponding to the third opening 63 being reserved on the photoresist 81, and the second inorganic spacer portion 402 and the second inorganic encapsulation part 312 on the bottom of the third opening 63 are removed to form a first opening 61 in the second inorganic encapsulation part 312 and to form a second opening 62 in the second inorganic spacer portion 402 to expose a partial upper surface of the first metal trace 211.

Thereafter, the photoresist 81 is removed.

A touch metal layer 50 is formed on one side of the inorganic spacer layer 40 away from the substrate, and includes multiple touch electrodes located in the display region 101 and separately distributed, and touch traces 51 connected to the touch electrodes. The touch trace 51 extends to the wire replacement region 1021, passes through the first opening 61, the second opening 62 and the third opening 63, and is electrically connected to the first metal trace 211.

Referring to FIGS. 3, 4, 7 and 9*a* to 9*d*, the manufacturing method of the display panel in another embodiment of this disclosure includes the following steps.

The substrate 10 is provided.

The thin film transistor layer 20 is formed on the substrate 10, and includes the first metal layer 21, the second metal layer 22 and the insulating layer 23. Further, the first metal layer 21 may include devices such as a source, a drain and a data line and the like, the second metal layer 22 may include devices such as a gate, a gate line and the like, and the insulating layer 23 may include insulating sub-layers located between the above-mentioned devices.

It is to be described that in the cross-section structure diagram of the display panel provided by the embodiment of this disclosure, only the structure of one side of the display panel near the non-display region is shown, and the drawing may show that the thin film transistor layer 20 includes the above-mentioned film layer but is not limited to the above-mentioned film layer. In addition, the stacking configuration of the first metal layer 21, the second metal layer 22 and the insulating layer 23 in the drawing only corresponds to the structure near one side of the non-display region 102, and the stacking configuration of the first metal layer 21, the second metal layer 22 and the insulating layer 23 in the display region 101 may be configured according to the thin film transistor array structure in the conventional OLED display panel, so no restriction is made thereto.

In this embodiment, the first metal layer 21 includes the source, the drain, the data line and the like disposed in the display region 101, and the first metal layer 21 further includes the first metal trace 211 disposed in the wire replacement region 1021.

The thin film transistor layer 20 further includes the interlayer insulating layer 70 disposed on one side of the first metal layer 21 away from the substrate 10, a material of the interlayer insulating layer 70 includes an organic material, and a part of the interlayer insulating layer 70 disposed in the display region 101 may be used as a planarization layer and may function as an insulating layer in the wire replacement region 1021 to cover the first metal trace 211.

Thereafter, a pixel definition layer (not shown in the drawing) is formed on one side of the interlayer insulating layer 70 away from the substrate 10, and the pixel definition layer is formed with multiple pixel openings in the display region 101. Each pixel opening is formed with a light-emitting unit. The pixel definition layer is further stacked with the interlayer insulating layer 70 in the non-display region 102 to form the bank structure 24, which specifically includes the first bank 241 disposed near one side of the display region 101, and the second bank 242 disposed on one side of the first bank 241 away from the display region 101.

Next, a third opening 63 is formed on a part of the interlayer insulating layer 70 and in the wire replacement region 1021 to expose a partial upper surface of the first metal trace 211.

The encapsulation layer 30 is formed on one side of the interlayer insulating layer 70 away from the substrate 10, and includes the inorganic encapsulation sub-layer 31. The inorganic encapsulation sub-layer 31 includes a first inorganic encapsulation part 311 located in the display region 101, and a second inorganic encapsulation part 312 connected to the first inorganic encapsulation part 311 and located on one side of the bank structure 24 away from the display region 101. Specifically, the first inorganic encapsulation part 311 may cover the display region 101 and extend to one side of the bank structure 24 away from the display region 101, and the second inorganic encapsulation part 312 is connected to the first inorganic encapsulation part 311 and extends toward one side of the bank structure 24 away from the display region 101 to cover the wire replacement region 1021. Because the inorganic encapsulation sub-layer 31 may be prepared by using the chemical vapor deposition, the thickness of the inorganic encapsulation sub-layer 31 at the edge decreases, and the thickness of the second inorganic encapsulation part 312 is less than the thickness of the first inorganic encapsulation part 311.

The second inorganic encapsulation part 312 further covers a bottom and a sidewall of the third opening 63.

The inorganic spacer layer 40 is formed on one side of the encapsulation layer 30 away from the substrate 10, and includes the first inorganic spacer portion 401 corresponding to the first inorganic encapsulation part 311, and the second inorganic spacer portion 402 corresponding to the second inorganic encapsulation part 312.

The second inorganic spacer portion 402 further covers the bottom and the sidewall of the third opening 63. That is, the second inorganic spacer portion 402 covers the second inorganic encapsulation part 312.

Optionally, a material of the inorganic spacer portion 401/402 includes at least one of silicon oxide or silicon nitride.

The photoresist 82 is coated on the inorganic spacer layer 40, and at least covers one side of the bank structure 24 near the display region 101 to expose the inorganic encapsulation sub-layer 31 and the inorganic spacer layer 40 in the wire replacement region 1021. Next, the inorganic encapsulation sub-layer 31 and the inorganic spacer layer 40 not covered by the photoresist 82 are removed to expose the bottom and the sidewall of the third opening 63 and to expose an upper surface located in the interlayer insulating layer 70 and not covered by the photoresist 82. Optionally, the second inorganic encapsulation part 312 and the second inorganic spacer portion 402 may be removed.

Thereafter, the photoresist 82 is removed.

A touch metal layer 50 is formed on one side of the inorganic spacer layer 40 away from the substrate, and includes multiple touch electrodes located in the display region 101 and separately distributed, and touch traces 51 connected to the touch electrodes. The touch trace 51 extends to the wire replacement region 1021 and is electrically connected to the first metal trace 211 through the third opening 63.

In addition, the embodiment of this disclosure further provides a display device including a main device body and the display panel in the above-mentioned embodiment, or the display panel manufactured by using the manufacturing method of the display panel in the above-mentioned embodiment, wherein the main device body and the display panel are combined together.

In summary, the embodiment of this disclosure is configured to provide the inorganic spacer layer 40 stacked with the inorganic encapsulation sub-layer 31 in the display panel, so that the thickness of the inorganic film layer in the wire replacement region 1021 can be increased. Further, it is beneficial to the removing of the inorganic encapsulation sub-layer 31 and the inorganic spacer layer 40 in the wire replacement region 1021 at a time in the etching process, and the wire replacing and bridging between the touch trace 51 and the first metal trace 211 can be implemented through the wire replacement region 1021. Accordingly, this disclosure can be configured such that the wire replacement region 1021 is located at a position closer the display region 101 without the need of considering the phenomenon of the poor contact caused by the reason that the inorganic encapsulation sub-layer 31 extends into the wire replacement region 1021, and thus has the thickness that is too thin to be effectively etched. Further, the distance between the wire replacement region 1021 and the display region 101 can be decreased, a bezel width of the display panel can be decreased, and a narrow bezel display panel can be implemented.

In the above-mentioned embodiments, the description of each embodiment has its own focus. For parts that are not described in detail in one embodiment, reference can be made to the relevant description of other embodiments.

Detailed introductions have been made to the display panel, the manufacturing method thereof and the display device provided by the embodiments of this disclosure. In this disclosure, specific examples are used to explain the principles and implementation of this disclosure, and the description of the above-mentioned embodiments is only used to help readers understand the technical solutions and core ideas of this disclosure. Those of ordinary skill in the art should understand that: they can still modify the technical solutions described in the foregoing embodiments, or equivalently replace some of the technical features; and these modifications or replacements do not cause the essence of the corresponding technical solutions to deviate from the scope of the technical solutions of the embodiments of this disclosure.

What is claimed is:

1. A display panel, comprising a display region and a non-display region disposed on at least one side of the display region, the non-display region comprising a wire replacement region;

wherein the display panel further comprises:

a substrate;

a thin film transistor layer disposed on the substrate and comprising a first metal layer, wherein the first metal layer comprises a first metal trace at least disposed in the wire replacement region;

an encapsulation layer disposed on one side of the thin film transistor layer away from the substrate, and comprising an inorganic encapsulation sub-layer;

a spacer layer, wherein the spacer layer and the inorganic encapsulation sub-layer are stacked on the one side of the thin film transistor layer away from the substrate; and a touch metal layer disposed on the inorganic encapsulation sub-layer and on one side of the spacer layer away from the substrate, and comprising a touch trace at least disposed in the wire replacement region, wherein the touch trace is electrically connected to the first metal trace in the wire replacement region;

wherein the inorganic encapsulation sub-layer does not overlap with the wire replacement region.

2. The display panel according to claim 1, further comprising a bank structure disposed on the substrate and in the non-display region and disposed between the wire replacement region and the display region;

wherein both of the inorganic encapsulation sub-layer and the spacer layer cover the bank structure, and extend from the bank structure in a direction away from the display region.

3. The display panel according to claim 2, wherein on one side of the bank structure away from the display region, a thickness of the inorganic encapsulation sub-layer close to the bank structure is greater than a thickness of the inorganic encapsulation sub-layer away from the bank structure.

4. The display panel according to claim 3, wherein boundaries of the inorganic encapsulation sub-layer and the spacer layer in the non-display region are both disposed between the bank structure and the wire replacement region.

5. The display panel according to claim 3, wherein the inorganic encapsulation sub-layer is provided with a first opening in the wire replacement region; and the spacer layer is provided with a second opening corresponding to the first opening, and the touch trace is electrically connected to the first metal trace through the first opening and the second opening.

6. The display panel according to claim 5, wherein the spacer layer is further disposed on a sidewall of the first opening, and a size of the second opening is less than a size of the first opening.

7. The display panel according to claim 6, wherein the thin film transistor layer is provided with a third opening in the wire replacement region, the inorganic encapsulation sub-layer is further disposed on a sidewall of the third opening, the size of the first opening is less than a size of the third opening, and the touch trace is electrically connected to the first metal trace through the first opening, the second opening and the third opening.

8. The display panel according to claim 1, wherein the encapsulation layer comprises a first inorganic encapsulation sub-layer, an organic encapsulation sub-layer and a second inorganic encapsulation sub-layer arranged in a stacked manner, and the inorganic encapsulation sub-layer comprises the first inorganic encapsulation sub-layer and the second inorganic encapsulation sub-layer.

9. The display panel according to claim 1, wherein the spacer layer does not overlap with the wire replacement region.

10. A display device, comprising a main device body and a display panel, wherein the main device body and the display panel are combined together, the display panel comprises a display region and a non-display region disposed on at least one side of the display region, and the non-display region comprises a wire replacement region;

wherein the display panel further comprises:

a substrate;

a thin film transistor layer disposed on the substrate and comprising a first metal layer, wherein the first metal layer comprises a first metal trace at least disposed in the wire replacement region;

an encapsulation layer disposed on one side of the thin film transistor layer away from the substrate, and comprising an inorganic encapsulation sub-layer;

a spacer layer, wherein the spacer layer and the inorganic encapsulation sub-layer are stacked on the one side of the thin film transistor layer away from the substrate; and a touch metal layer disposed on the inorganic encapsulation sub-layer and on one side of the spacer layer away from the substrate, and comprising a touch trace at least disposed in the wire replacement region, wherein the touch trace is electrically connected to the first metal trace in the wire replacement region;

wherein the inorganic encapsulation sub-layer does not overlap with the wire replacement region.

11. The display device according to claim 10, wherein the display panel further comprises a bank structure disposed on the substrate and in the non-display region and disposed between the wire replacement region and the display region;

wherein both of the inorganic encapsulation sub-layer and the spacer layer cover the bank structure, and extend from the bank structure in a direction away from the display region.

12. The display device according to claim 11, wherein on one side of the bank structure away from the display region, a thickness of the inorganic encapsulation sub-layer close to the bank structure is greater than a thickness of the inorganic encapsulation sub-layer away from the bank structure.

13. The display device according to claim 12, wherein boundaries of both the inorganic encapsulation sub-layer and the spacer layer in the non-display region are disposed between the bank structure and the wire replacement region.

14. The display device according to claim 12, wherein the inorganic encapsulation sub-layer is provided with a first opening in the wire replacement region; and the spacer layer is provided with a second opening corresponding to the first opening, and the touch trace is electrically connected to the first metal trace through the first opening and the second opening.

15. The display device according to claim 14, wherein the spacer layer is further disposed on a sidewall of the first opening, and a size of the second opening is less than a size of the first opening.

16. The display device according to claim 15, wherein the thin film transistor layer is provided with a third opening in the wire replacement region, the inorganic encapsulation sub-layer is further disposed on a sidewall of the third opening, the size of the first opening is less than a size of the third opening, and the touch trace is electrically connected to the first metal trace through the first opening, the second opening and the third opening.

17. The display device according to claim 10, wherein the encapsulation layer comprises a first inorganic encapsulation sub-layer, an organic encapsulation sub-layer and a second inorganic encapsulation sub-layer arranged in a stacked manner, and the inorganic encapsulation sub-layer comprises the first inorganic encapsulation sub-layer and the second inorganic encapsulation sub-layer.

18. The display device according to claim 10, wherein a material of the spacer layer comprises at least one of silicon oxide or silicon nitride.

19. The display device according to claim 10, wherein the spacer layer does not overlap with the wire replacement region.

* * * * *